United States Patent [19]
Gore et al.

[11] Patent Number: 5,495,399
[45] Date of Patent: Feb. 27, 1996

[54] SHIELD WITH DETACHABLE GRASP SUPPORT MEMBER

[75] Inventors: Kiron Gore, Arlington Heights, Ill.; Thomas A. Goodwin, Coral Springs; Benjamin J. Hafen, Sunrise, both of Fla.

[73] Assignee: Motorola, Inc., Schaumburg, Ill.

[21] Appl. No.: 270,280

[22] Filed: Jul. 5, 1994

[51] Int. Cl.$^6$ ................................................. H05K 5/02
[52] U.S. Cl. .................... 361/814; 361/796; 361/816; 361/818; 257/659; 174/35 R
[58] Field of Search .................................. 361/814, 816, 361/818, 800, 796, 810; 174/35 TS, 35 R; 439/108, 109; 220/402; 455/300; 333/246, 247; 257/8, 659, 660

[56] References Cited

U.S. PATENT DOCUMENTS

| | | | |
|---|---|---|---|
| 4,621,373 | 11/1986 | Hodsdon | 455/89 |
| 5,045,971 | 9/1991 | Ono et al. | 361/386 |
| 5,281,169 | 1/1994 | Kiat et al. | 439/607 |

*Primary Examiner*—Leo P. Picard
*Assistant Examiner*—Y. Whang
*Attorney, Agent, or Firm*—Andrew S. Fuller

[57] ABSTRACT

A shield (100) having a detachable grasp support member (140) is provided. The shield (100) includes a hollowed frame (110) having first and second surfaces (112, 114), and a cavity (130) extending from the first surface (112) to the second surface (114). A detachable grasp support member (140) is attached to the hollowed frame (110) and extends across at least a portion of the cavity (130). A second shield member (160) mounts onto the frame (110) and covers the cavity (130) along the first surface (112) to complete the shield (100).

8 Claims, 3 Drawing Sheets

5,495,399

SHIELD WITH DETACHABLE GRASP SUPPORT MEMBER

TECHNICAL FIELD

This invention relates to shields, such as electrical shields typically used to protect components in an electronic assembly.

BACKGROUND OF THE INVENTION

Electronic products typically have electrical circuitry implemented on a circuit substrate, such as a printed circuit board. Portions of the circuitry may be adversely affected by electromagnetic interference, electrostatic discharge, and other environmental factors. Additionally, many electrical components generate electromagnetic interference which may adversely affect the operation of other portions of the circuitry. Consequently, such products often incorporate shields, or other protective devices, to protect critical portions of the circuitry, or specific components.

A metallized enclosure, such as a metal can, is commonly used as a shield for protecting sensitive electrical components. During assembly of the electronic product, the shield is placed over the circuitry or components to be protected and secured to the circuit substrate, such as by soldering and the like. A one-piece shield which fully encloses the components is relatively simple and inexpensive to manufacture. However, once secured to the circuit substrate, the protected components are inaccessible for testing, such as by visual inspection, and for analysis and repair without physically removing the shield. If the shield had been soldered to the circuit substrate, removal of the shield might involve reheating of solder and manipulation of the shield which may result in the creation of defects by inadvertently altering other portions of the electrical circuitry. Another option involves the use of a two-piece shield design. The two-piece shield includes a hollow-top frame, and a corresponding cover which fits over the frame. The frame provides a mounting platform support for the cover. The shield is completed when the cover is mounted on the frame. Ordinarily, the cover is mounted late in the assembly process so that the protected components is accessible for testing, such as by visual inspection, and for analysis and repair without the removal of the frame.

Although, solving the problem of access to shielded components, the two-piece shield with the hollow-top frame has some problems. First, the frame is difficult to handle by conventional pick and place machine using gripping techniques such as vacuum suction. For example, multiple vacuum nozzles may be needed to securely grip the piece for placement. Additionally, the frame tends to lack rigidity because of its hollow top. It is desirable to provide a shield which facilitates the testing, analysis, and repair of components during the manufacturing process. However, such a shield should permit ease of handling for assembly. Accordingly, there exists a need for a new shield design.

DETAILED DESCRIPTION OF THE PREFERRED EMBODIMENT

Figure 1:
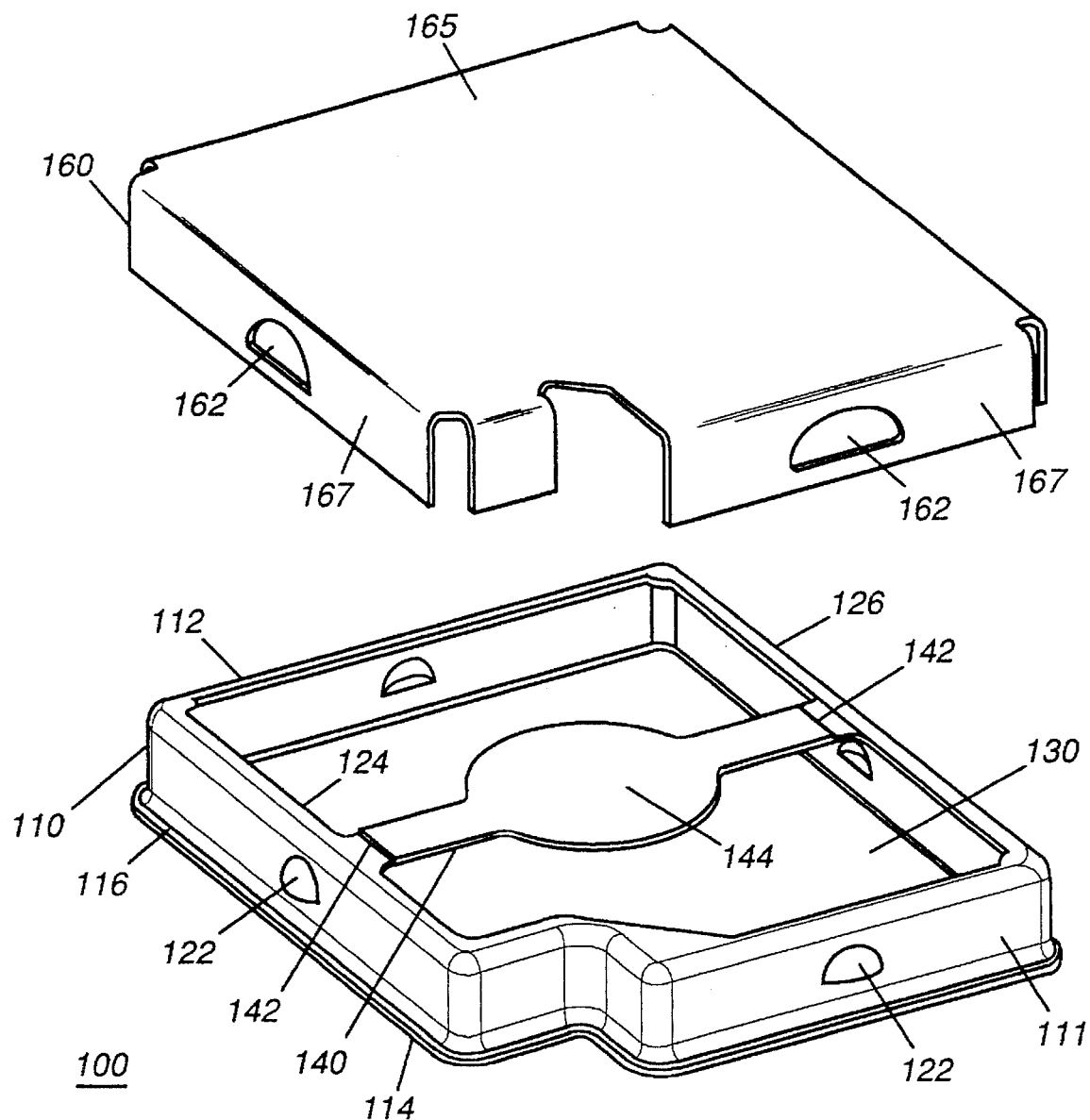
FIG. 1 is an exploded perspective view of a two-piece shield in accordance with the present invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, an exploded perspective view of a shield 100 is shown, in accordance with the present invention. The shield 100 comprises a two-piece set including a first shield portion or mount platform 110, and a second shield portion or cover 160, formed to mount onto the mount platform 110. The mount platform 110 is formed as a hollowed frame or shell like structure from stamped sheet metal, or other like process. The hollowed frame 110 has a substantially rectangular wall member 111, which extends peripherally, in multiple wall segments 124, 126, around the mount platform 110 in a fenced enclosure arrangement. The height of the wall member 111 substantially defines the height of the mount frame 110. The wall member 111 is shaped such that the mount frame 110 accommodates a particular design configuration. The mount frame 110 has a first or top surface 112, and a second or bottom surface 114, and the wall member 111 defines a cavity 130 or opening extending from the first surface 112 to the second surface 114. The cavity 130 substantial encompasses the first surface 112 and extends through the mount frame 110 through to the second surface 114. The mount frame 110 has at least two pairs of opposing wall segments 124, 126 bordering the cavity 130. A lip 116, extending around the periphery of the mount frame 110 along the first surface 112, provides an extended surface area 144 for securing the mount platform 110 to a support member. The mount frame 110 also has retention supports in the form of small projections 122 jutting from the wall member 111.

The mount platform 110 is typically secured, such as by soldering, to a support member, such as a circuit substrate, housing electrical components, in an electrical module. Preferably, the mount platform 110 is easily manipulable by automated placement equipment used in the assembly of the electrical module. Accordingly, the present invention provides for the incorporation of a grasp support member 140, or bridge member, with the mount frame 110, to facilitate the use of automated placement equipment. The grasp support member 140 is a thin elongated strip of material extending across the cavity 130. Further, the grasp support member 140 has a portion with an expanded surface area 144 to support grasping by automated equipment. This configuration is particularly applicable when robotic gripper assemblies using vacuum nozzles are used for pick and place operations. Preferably, the grasp support member 140 does not cover a substantial part of the cavity 130 so as not to obscure vision through the cavity 130. Additionally, the grasp support member 140 is also formed to be detachable such that it is easily removable to provide access to components covered by the mount frame 110. In the preferred embodiment, the grasp support member 140 is integrally formed with the mount frame 110 in a single manufacturing process, such as by stamping and the like. The grasp support member 140 extends along the top surface 112 across at least a portion of the cavity 130, from a point adjacent to a first wall segment 124, to a point adjacent to a second opposing wall segment 126. The grasp support member 140 has opposing ends scored or scribed adjacent to their attachment points near the wall segments 124, 126 to provide weakened junctures 142. The weakened junctures 142 facilitate the detachment of the grasp support member 140 from the mount frame 110.

The cover 160 mounts onto the mount frame 110 to complete the two-piece shield 100 assembly. In the preferred embodiment, the cover 160 is formed from stamped sheet metal or similar process. The cover 160 has a planar surface 165 with depending sidewalls 167, and is shaped to snugly fit over the contours of the mount frame 110. Retention slots 162 formed in the side walls 167 of the cover 160 fit retention supports in the form of projections 122 present on the sides of the mount frame 110. The cover 160 snaps over the mount frame 110, and is secured in place by the retention projections 122 of the mount frame 110. When mounted, the cover 160 covers the cavity 130 about the top surface 112.

Figure 2:
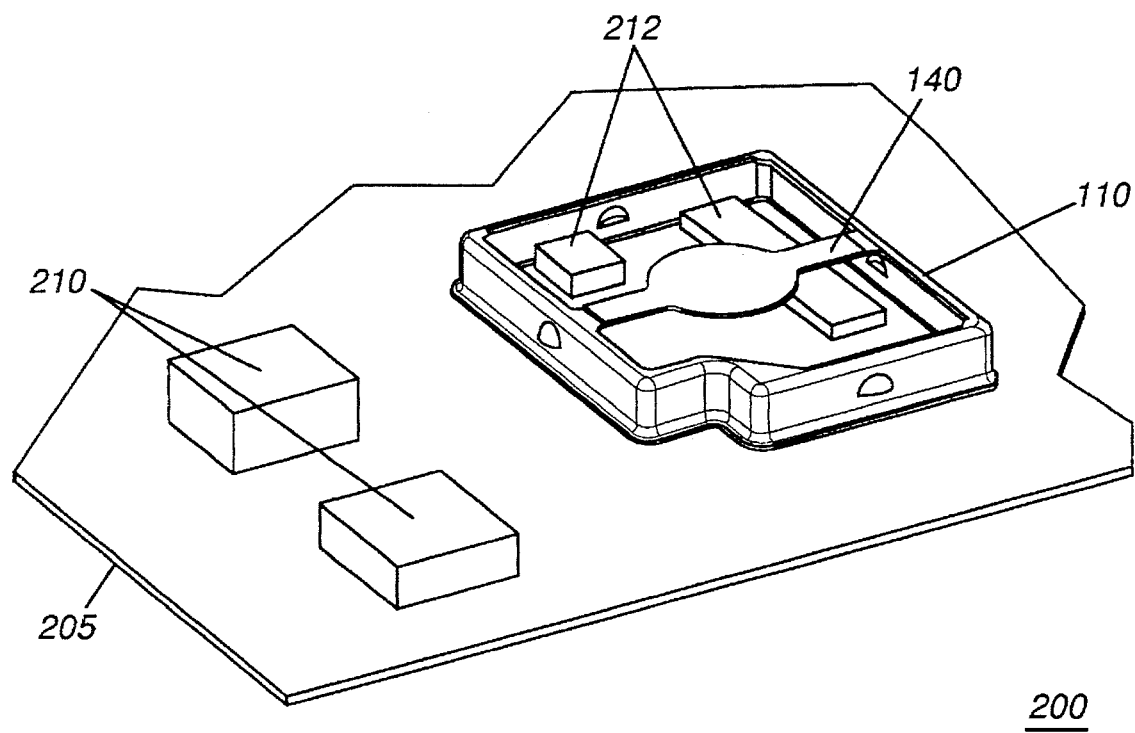
FIG. 2 is a perspective view of an electronic assembly incorporating the shield in accordance with the present invention.

The design of the shield 100 facilitates its use in the assembly of an electronic module. Referring to FIG. 2, a fragmentary perspective view of an electronic assembly 200 is shown in accordance with the present invention. The electronic assembly 200 includes a circuit substrate, such as a printed circuit board 205, electrical components 210, 212 disposed on the printed circuit board, and a two-piece shield 100 (only the mount frame portion 110 shown), in accordance with the present invention. The mount frame 110 is installed over electrical components 212 which are to be protected against electromagnetic interference. A significant aspect of the present invention is the facility that the mounted frame 110 offers during assembly operations. In a typical assembly sequence, electronic components are placed, such as by automated placement equipment, on the printed circuit board 205. Typically, solder is pre-placed at locations where the components are to be placed. The mount frame 110 of the two-piece shield 100 is designed to be placed in similar fashion as the components 210, 212. Thus, a robot gripper assembly (not shown) having a vacuum nozzle can be used to place the electrical components, and also to place the mount frame 110 in an appropriate location on the printed circuit board 205.

Generally, the components are temporarily secured to the printed circuit board using flux or other tacking media and the entire assembly placed in an oven to reheat (reflow) the preplaced solder to secure the components, including the mount frame 110, to the printed circuit board. In the case of the mount frame 110, a vacuum nozzle can be used to grip the mount frame 110 by the grasp support member 140 along the expanded surface area 144. Note that the open top nature of the mount frame 110 together with the design of the grasp support member 140 enables visual inspection of the components beneath the mount frame 110. Thus, a portion of the shield 100 is secured to the printed circuit board 205 using common part placement techniques while allowing inspection of the components, which are to be shielded, in subsequent manufacturing operations.

The grasp support member 140 provides both a gripping surface for a robotic device, as well as provide rigidity to the mount frame 110 during handling. At times, the electrical components 212 beneath the mount frame 110 must be repaired or replaced when a defect is detected. The grasp support member 140 can be removed along the weakened portions 142. The scoring of the grasp support member 140 near where it adjoins the remainder of the frame 110 facilitates the clean separation of the grasp support member 140 from the frame 110. For example, the middle 144 of the grasp support member 140 is first sheared with cutters, each half is then bent outward and broken by repeatedly bending it back and forth until broken off. The scored portions 142 along the edges of the grasp support member 140 permit the controlled removal of the grasp support member 140. In a subsequent operation, typically further along in the manufacturing process after most testing has been completed, the shield cover 160 is snapped on to the mount frame 110 and secured to complete the shield 100.

Figure 3:
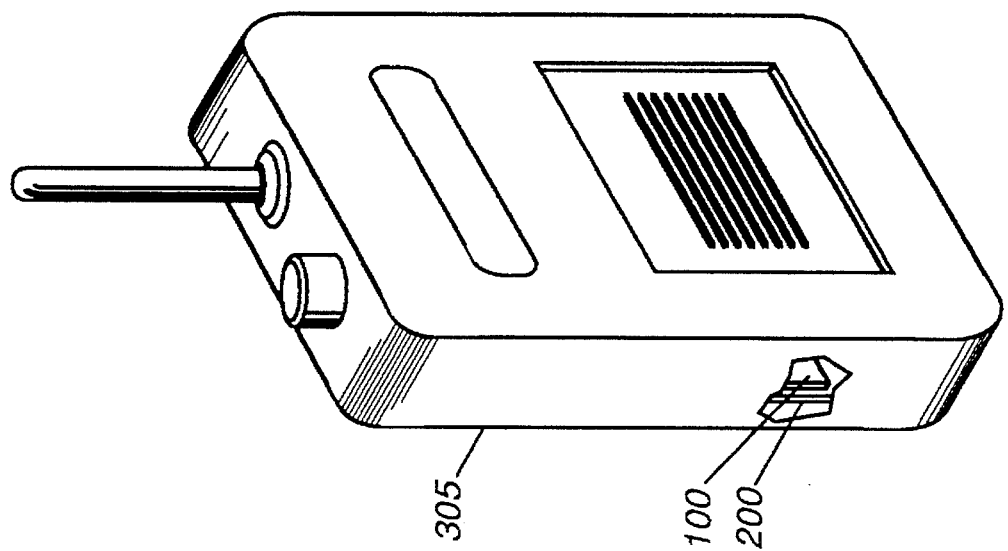
FIG. 3 is a perspective view of a radio incorporating the electronic assembly of FIG.2, in accordance with the present invention.

Referring to FIG. 3, a front view of a communication device 300 that incorporates the present invention is shown. The communication device 300 is a conventional two-way radio, as known in the art, which houses communication circuitry for communicating over a radio frequency channel. The communication device includes a device housing 305 which receives the electronic assembly 200, including the two-piece shield 100 of the present invention.

The present invention has significant advantages, particularly in the area of manufacturing efficiency. As in the preferred embodiment, the two-piece shield 100 design allows a portion of the shield 100, i.e., the mount frame 110, to be placed on a circuit substrate, such as printed circuit board, using standard part placement techniques. As such robotic devices, such as those using vacuum nozzles for gripping, can be used to pick and place the mount frame 110 using operations similar to that used for other components. Thus, a separate robotic station might not be needed in a typical automated assembly factory. The two-piece shield 100 design enables the base portion of the shield 100, i.e., the mount frame 110, to be placed over components while providing access to these components for testing, visual inspection, and repair or replacement if necessary. The grasp support member 140 provides rigidity for the mount frame 110 to facilitate handling, and provides a gripping surface for use by a robotic gripper assembly. The grasp support member 140 is formed for easy removal if necessary to repair or replace components beneath the mount frame 110. Hence, the two-piece shield 100 according to the present invention facilitates the manufacturing process, and thus can contribute to an improvement in manufacturing efficiency and a reduction in manufacturing costs.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A shield, comprising:

a first shield member comprising a hollowed frame having first and second surfaces, and a cavity extending from the first surface to the second surface;

a detachable grasp support member attached to the hollowed frame and extending across at least a portion of the cavity, the grasp support member being integrally formed on the first shield member, and having first and second opposing ends, the first and second opposing ends being attached to the first shield member by first and second weakened junctures, respectively; and a second shield member mounted on the first shield member and covering the cavity about the first surface.

2. The shield of claim 1, wherein the grasp support member is scored at the junctures to aid in detachment from the first shield member.

3. The shield of claim 1, wherein the first shield member has a first retention support, and the second shield member has a second retention support for mating with the first retention support.

4. A two-piece shield for shielding components on an electronic assembly, the shield comprising:

a first shield member comprising a walled enclosure having opposing first and second surfaces and a cavity extending from the first surface to the second surface;

a grasp support member integrally formed on the first shield member and extending across a portion of the cavity along the first surface, the grasp support member being planar and having weakened portions to aid in detachment from the first shield member, the grasp support member having a portion with an expanded surface area; and a second shield member mounted on the first shield member and covering the cavity about the first surface.

5. A shield comprising a mount platform, and a cover for mounting onto the mount platform, wherein:

the mount platform comprises:

a hollowed frame having first and second surfaces and a cavity extending from the first surface to the second surface;

a detachable bridge member attached to the hollowed frame and extending across at least a portion of the cavity, wherein the bridge member has an end attached to the hollowed frame by a weakened juncture; and the cover is formed to securely mount onto the mount platform such that the cavity about the first surface is covered.

6. The shield of claim 5, wherein the bridge member has portion having an expanded surface area.

7. The shield of claim 5, wherein the bridge member is scored at the juncture to aid in detachment from the hollowed frame.

8. A radio, comprising electronic assembly housing communication circuitry for communicating over a radio frequency channel, the electronic assembly including a shield, the shield comprising:

a first shield member comprising a hollowed frame having first and second surfaces, and a cavity extending from the first surface to the second surface;

a detachable grasp support member attached to the hollowed frame and extending across at least a portion of the cavity, the grasp support member being integrally formed on the first shield member, and having first and second opposing ends, the first and second opposing ends being attached to the first shield member by first and second weakened junctures, respectively; and a second shield member mounted on the first shield member and covering the cavity about the first surface.

* * * * *